(12) United States Patent
Kanev et al.

(10) Patent No.: US 7,652,491 B2
(45) Date of Patent: Jan. 26, 2010

(54) PROBE SUPPORT WITH SHIELD FOR THE EXAMINATION OF TEST SUBSTRATES UNDER USE OF PROBE SUPPORTS

(75) Inventors: Stojan Kanev, Thiendorf OT Sacka (DE); Hans-Jurgen Fleischer, Priestewitz (DE); Stefan Kreissig, Venusberg (DE); Karsten Stoll, Sohland an der Spree (DE); Axel Schmidt, Thiendorf OT Stölpchen (DE); Andreas Kittlaus, Bad Liebenwerda OT Theisa (DE)

(73) Assignee: SUSS MicroTec Test Systems GmbH (DE)

( * ) Notice: Subject to any disclaimer, the term of this patent is extended or adjusted under 35 U.S.C. 154(b) by 155 days.

(21) Appl. No.: 11/940,354

(22) Filed: Nov. 15, 2007

(65) Prior Publication Data

US 2008/0116917 A1    May 22, 2008

(30) Foreign Application Priority Data

Nov. 17, 2006    (DE) .................... 10 2006 054 693

(51) Int. Cl.
*G10R 31/28* (2006.01)
(52) U.S. Cl. ..................................... 324/754; 324/760
(58) Field of Classification Search .................. None
See application file for complete search history.

(56) References Cited

U.S. PATENT DOCUMENTS

| | | | | |
|---|---|---|---|---|
| 4,757,255 A | * | 7/1988 | Margozzi | 324/760 |
| 5,835,997 A | * | 11/1998 | Yassine | 324/754 |
| 5,963,027 A | * | 10/1999 | Peters | 324/158.1 |
| 6,194,907 B1 | * | 2/2001 | Kanao et al. | 324/760 |
| 6,232,790 B1 | * | 5/2001 | Bryan et al. | 324/754 |
| 6,812,720 B1 | * | 11/2004 | Cheng et al. | 324/755 |
| 7,173,440 B2 | * | 2/2007 | Kishida | 324/754 |
| 7,250,779 B2 | * | 7/2007 | Dunklee et al. | 324/754 |
| 7,279,911 B2 | * | 10/2007 | Tunaboylu et al. | 324/754 |

FOREIGN PATENT DOCUMENTS

| | | | |
|---|---|---|---|
| JP | 58101434 A | * | 6/1983 |
| JP | 2000338134 A | * | 12/2000 |
| JP | 2001153885 A | * | 6/2001 |

* cited by examiner

*Primary Examiner*—Paresh Patel
(74) *Attorney, Agent, or Firm*—Heslin Rothenberg Farley & Mesiti P.C.

(57) ABSTRACT

A probe support for holding probes which serve for electrical contacting of test substrates in a prober for testing purposes comprises a probe card holder, a probe card, and a probe card adapter, The probe card and probe card adapter are electrically connected to one another as well as to a shield of electrically conductive material and are disposed such that the probe card lies in a passageway of a shield. The shield is disposed between the test substrates and the probe card holder and is electrically insulated from the holder. For testing test substrates their positioning with respect to the probes held in this manner is done by angular alignment of the contact surfaces of the test substrates to the sensor tips and the movement of the test substrates along a path which starts from a first reference position and is composed up to the first, and each additional, contact position of an x-component and a y-component.

12 Claims, 6 Drawing Sheets

PROBE SUPPORT WITH SHIELD FOR THE EXAMINATION OF TEST SUBSTRATES UNDER USE OF PROBE SUPPORTS

CROSS REFERENCE TO RELATED APPLICATIONS

This application claims priority of German patent application No. 10 2006 054 693.8, filed Nov. 17, 2006.

BACKGROUND ART

The invention relates to a probe support for holding probes which serve for electrical contacting of test substrates in a prober for testing purposes. The invention also relates to a process for testing test substrates in a prober with such a probe support.

In the probers the different test substrates are tested with regard to their electrical properties or are subjected to a special test. In such testing, the test substrates can be in different stages of manufacturing and integration. Thus, tests of semiconductor chips, hybrid components, micromechanical and micro-optical components, and the like are carried out which are in the complete wafer or separated or are already integrated in more or less complex circuits.

For the development and production of electronic components it is necessary to perform the most varied tests and checks at various stages of manufacturing. As is known, for this purpose probers are used which comprise essentially a chuck with a surface for receiving electronic components which are to be tested, the test substrates. The chuck can usually be traversed in the x-direction and the y-direction. The prober furthermore comprises a probe support with probes for electrical contacting of the test substrates. To produce the electrical contact, in addition to the traversability in the x-y plane, which is always defined as that plane in which the receiving surface of the chuck lies, relative movement in the z-direction between the probes and the test substrates is necessary. The required movements in the z-direction can usually be realized by the chuck in connection with a positioning device of the probe support.

The most varied positioning devices for moving the chuck or the probes or the probe support or several of these components, as well as different movement processes following from this, are known with which the relative movements necessary for positioning the probes or the test substrates or both and the relative movements necessary for contacting by the probes can be carried out. With increasing integration density and, associated therewith, minimization of the size of the contact surfaces, the demands on the precision of positioning of probes and test substrates is becoming ever greater, in particular if it is necessary to sequentially traverse to the individual positions of a plurality of test substrates which are disposed in the complete wafer or separated in the form of a grid on the chuck. For this, the wafer or the individual test substrates are disposed on the chuck so that their grid agrees very precisely with the x-direction of motion and the y-direction of motion of the chuck or the probes, that is, the grid and the corresponding directions of motion of the positioning devices are in line. The traversing to the individual positions of the test substrates is then done by incrementally traversing through the grid in the x-direction or the y-direction.

For testing, a definite arrangement of probes, usually corresponding to the density and the size of the contact surfaces and test tips adapted according to the test signal are simultaneously set on the contact surfaces of a test substrate and the test substrate is energized with a signal or a signal is picked up from the test substrate. Then contact is broken off, one traverses to the position of the test substrate coming next in the x-direction or the y-direction, and it is contacted for testing. This structure requires not only the precise alignment of the test substrate on the chuck, but rather also the precise angular alignment of the arrangement of the probes to the contact surfaces to be contacted at the same time.

BRIEF SUMMARY OF THE INVENTION

For adaptability to the various test substrates and their arrangement, the arrangement of the probes which corresponds to the arrangement of a test substrate's contact surfaces which are to be contacted at the same time, is, in tests of this type, frequently done on a card, the so-called probe card. In this case the probe support comprises, along with the probe card, a probe card adapter and a probe card holder. On the probe card the probes are disposed at a fixed position relative one another and in the mounted state of the probe support with a fixed position with respect to the probe support and at the same time the incoming lines to the individual probes are realized so that they are fixed. The probes and/or the incoming lines can be fastened to the probe card's side facing towards the test substrate as well as on the probe card's side facing away from the test substrate. In the latter case there is a passageway for the sensor tips in the probe card. Through this passageway the test substrate is contacted.

The probe cards consist as a rule of electrically insulating material, e.g., printed circuit board material. However, other materials are also used to the extent that their electrical and mechanical properties are sufficient for the particular requirements of the test. The different probe cards are adapted to the probe support by means of the probe card adapter on the probe card holder. Alternatively, the probe card can also be adapted directly to the probe card holder so that the probe card adapter can be omitted.

In contradistinction to mounting the probes directly on the probe support, and thus with a definite position with respect to the chuck, the arrangement of the probes on probe cards with probe card adapters is associated with the difficulty that tolerances of fit between the individual components increase the demands on the alignment of the probes to the contact surfaces of the test substrates. To the extent that the probe cards are not rotationally symmetrical, this effect is amplified since turning the probe card for its angular alignment to the test substrate requires a correspondingly higher tolerance of the fit in the probe card adapter. In order to be able to turn the probe card to the necessary extent in the receiving opening of the probe card adapter, the receiving opening must be enlarged to be wide enough that the necessary free space for turning the probe card becomes available. This free space is frequently not filled up by the probe card so that unintended and disadvantageous gaps and passageways arise in the surface in which the probe card and probe card adapter lie.

Independently of the shape of the probe card, its angular alignment always proves to be difficult since no aids for this are available, comparable to, for example, the case of the positioning in the x-direction, y-direction, and z-direction. Rather, the angular alignment of the probe card, and thus of the probes, is done with their mounting in the probe card adapter and, in given cases, also its mounting in the probe card holder. In the case of a large grid of test substrates on the chuck, due to the cumulative effect of incorrect positioning, there is usually the necessity of recalibrations, which, in the testing of larger numbers of pieces, can lead to a significant time, and thus cost, factor.

The tests of the test substrates are frequently carried out under special environmental conditions which are realized by means of a housing which encloses the work area of the prober. For example, the housing consists of conductive material to avoid external electrical and electromagnetic influence on the test.

For the measurement of very small currents, where even slight parasitic electromagnetic induction can compromise the test, a triaxial structure of the measuring device including shielding is realized. In so doing, two shields are disposed lying opposite the measuring element, that is, near to the receiving surface of the chuck, said shields consisting of electrically conductive material. In the shielding the external element serves as a shield and the central element serves as a so-called guard. The guard is set to the same potential as the measuring element so that even a very slight leakage current between these two elements is avoided since it could corrupt the result of the measurement.

This triaxial structure can also be realized with respect to the enclosing housing. For this, an internal jacket is disposed within the external housing, said jacket being at the guard potential, that is, at the potential of the measuring element. The internal jacket is formed by a jacket of the chuck as well as by a guard plate which extends approximately parallel to the cover plate of the housing and is suspended electrically insulated from this cover plate. The probes are disposed outside of the housing so that the probe support, which in this case is formed by the cover plate of the housing, is at the potential of the housing, for example, at ground potential. It has proven itself disadvantageous in this arrangement that the opening of the guard plate for the passage of the probes to the test substrate is determined by the probes' traversing path which is required for the positioning of the probes with respect to the test substrate and its precise contacting and that as a consequence of that the guard plate does not extend over the area of measurement.

With the described probe support and the prober in which such a probe support is used, a shielding without gaps, even over the area of measurement, is provided.

The described probe support permits the shielding's passageway for the probes to be kept as small as possible and thus to achieve an optimal shielding. By the probe card adapter, as well as the shield which consists of electrically conductive material, being electrically insulated from the probe card holder and these two elements being electrically connected to one another, the parts of the probe card adapter which project into the passageway of the shield are included in the shielding. The shielding is thus spatially disposed between the test substrate and the probe support.

To the extent that the prober in which the probe support is used comprises an external, electrically conductive housing, the shielding is at the same time located between the test substrate and the housing so that by means of these two electrically conductive components a triaxial structure of the prober can be realized. Thus, due to the electrical insulation of the shield and probe card adapter from the probe card holder, a simple shielding with regard to EMI effects is possible as well as the guarding for measurements of smaller currents. In the latter case the receiving surface of the chuck is set to a first potential different from ground potential and the shield, and thus the probe card adapter, is set to a second potential which corresponds in magnitude to the first potential of the receiving surface of the chuck. In the shielding, the shield along with the probe card adapter, where the two can then function jointly as a shield, can be disposed in addition to the cover plate of the housing or can replace the cover plate. A potential difference between the shield and the housing is in fact not problematic since a possible leakage current between these two elements has no effect on the test. Nonetheless, the shield is regularly set to the potential of the housing.

Simultaneously, the positions of the probes with respect to one another and with respect to the probe support, said positions being set with the mounting of the probes on the probe support precisely and so that they are fixed, can also be used in this probe support. By corresponding configuration of the probe card adapter, e.g., by receiving surfaces facing towards the chuck for supporting and fixing the probe card, small gaps which result due to necessary tolerances of fit between the probe card and probe card adapter and which otherwise would interrupt a shielding or guarding, can be covered on the side facing towards the test substrate, e.g., by contact surfaces having the form of steps, and thus the passageway through the shield can be minimized. Through the capability of flexibly configuring the probe card adapter, the probe card adapter, and with it the probe card, can project into the passageway of the electrically conductive shield and fill it up almost completely.

To the extent that the described probe support and the probe card's surface facing towards the test substrate are also electrically conductive and electrically connected to the probe card adapter and in addition have no electrically conductive connection to the incoming electrical lines for the probes on the probe card, it is possible to further minimize the passageway in the shielding. In this development the shielding is formed by the shield, the probe card adapter, and the probe card itself. A passageway is then necessary if the probes are disposed on the probe card's upper side facing away from the test substrate. Its size can be reduced to the space required for the guiding through of the sensor tips and their arrangement with respect to one another. To the extent that incoming lines and probes are mounted on the underside, no passageway through the shielding is necessary. Here an electrical connection between the conductive surface of the probe card and the incoming lines is ensured long-term by a suitable structure of the probe card and insulation of the incoming lines.

The conductive surface of the probe card can be realized by various possibilities, for example, by a metallic coating or by the fastening of a metal plate to the probe card. As described above, the shielding as well as the guarding can also be realized with this development.

The described probe support can be realized without special mounting effort and with the necessary mechanical stability by, in one development, the shield or the probe card adapter or both being fastened to the probe card holder by means of electrically insulating mounting means. With this, movements of the entire probe support, e.g., in the z-direction, are possible. Moreover, the shielding for the test substrate is disposed in its vicinity and has a small size.

Since the described probe support has no effect on the positioning systems per se, neither on the positioning system of the chuck nor on a positioning system for moving the probes, it is also possible in a very simple manner to retrofit an existing prober which uses such a probe support with a probe card holder, a probe card adapter, and a probe card and thus to utilize the described advantages and developments.

With the described probe support a device for arranging probes is provided, said device reducing the complexity of angular alignment of the probe arrangement of the probe card. The probe support permits the mounting of probe cards or probe card adapters with larger angular deviations and adapts the shielding to this situation. With this, however, particular demands on the positioning process also follow, since these deviations must be compensated by corresponding positioning.

The process described in the following for positioning a test substrate, which is to be tested in a prober and is disposed on the receiving surface of a chuck, with respect to a probe arrangement which is held by the above-described probe support allows one to avoid, as described in the introduction, the enlargement of the receiving opening in the probe card adapter in which the probe card is inserted. With this, a shielding without interruption by gaps and openings can be realized.

Since, due to the described positioning processes, the angular alignment of the probe card to the contact arrangement of the test substrate by turning the probe card is not necessary. Rather, the angular alignment is compensated by turning the chuck. With this, the contact arrangement is in fact no longer in line with the x-direction of motion of the chuck and/or the y-direction of motion of the chuck but rather this angular difference is compensated by the particular traversing path of the chuck for traversing to the individual positions of the test substrates. This traversing path can also be adapted to test substrates disposed in the form of a grid, where the described positioning process can be done rapidly, precisely, and even automatically.

BRIEF DESCRIPTION OF THE DRAWING FIGS.

In the following the probe support and the positioning process are explained in more detail with the aid of an embodiment example.

In the corresponding drawings

DETAILED DESCRIPTION

Figure 1:
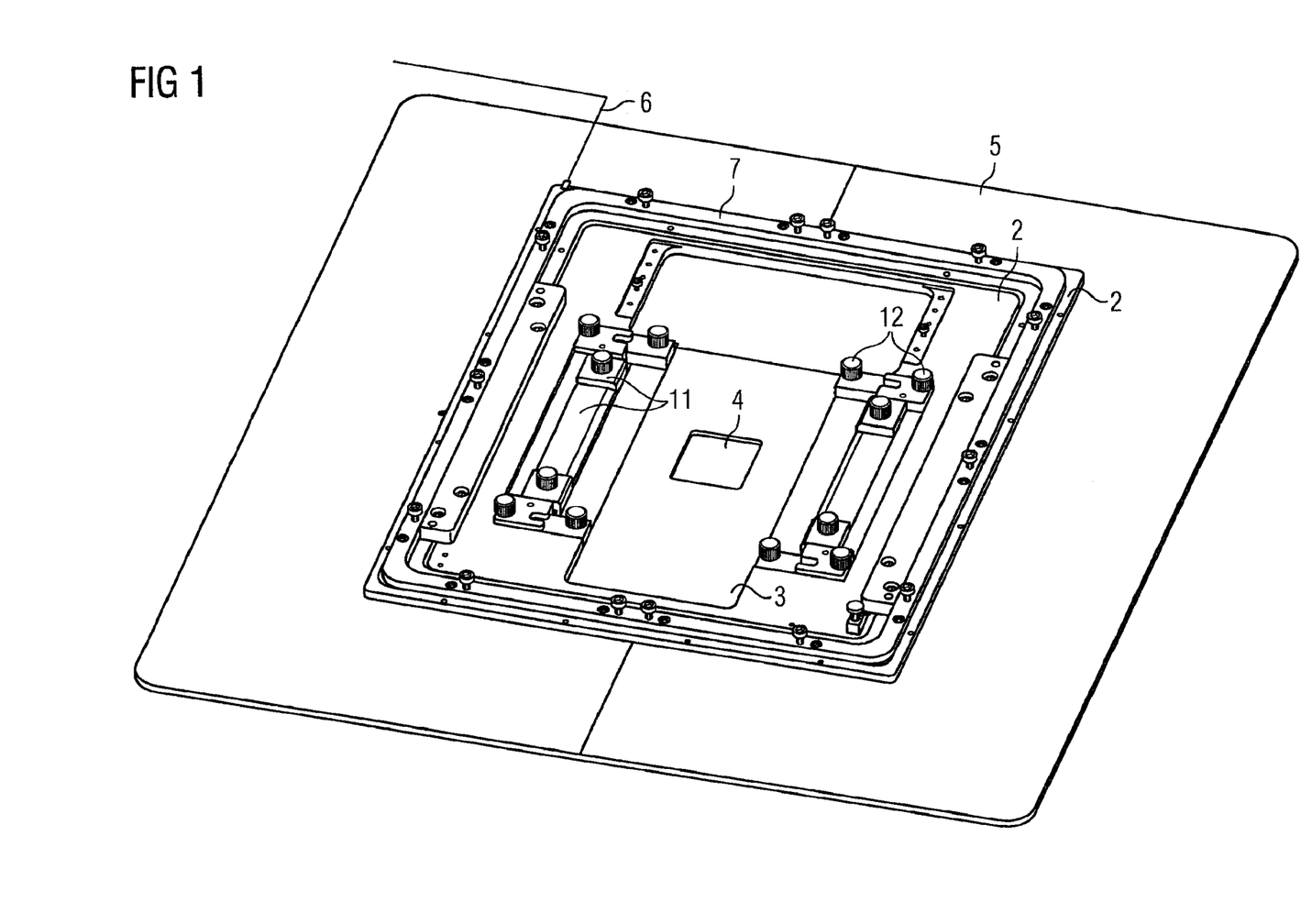
FIG. 1 shows a probe card adapter with probe card and shield in perspective representation.
Figures 2, 2A:
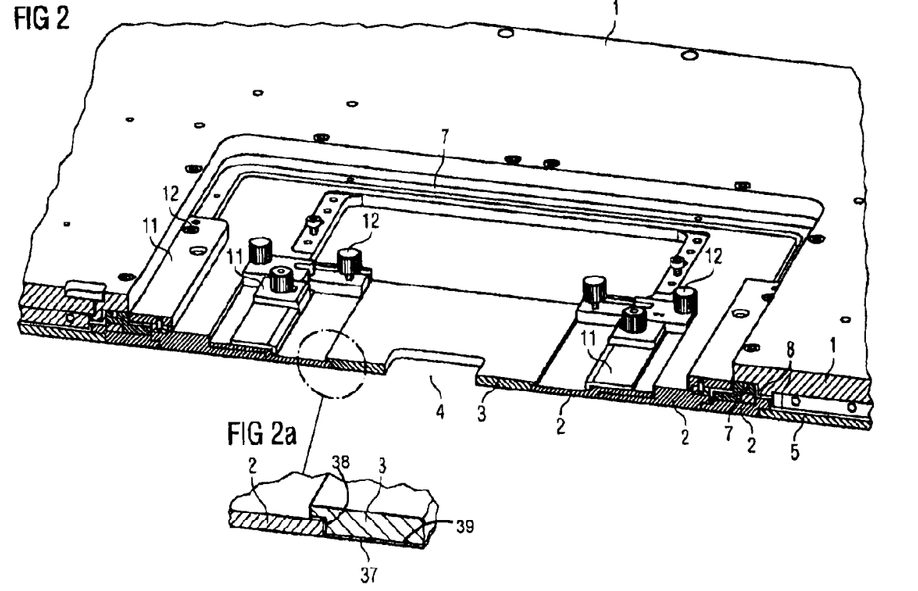
FIG. 2 shows, in sectioned representation, the component according to FIG. 1 and mounted on a probe card holder.
FIG. 2A shows a detail of the component shown in FIG. 2.
Figure 5:
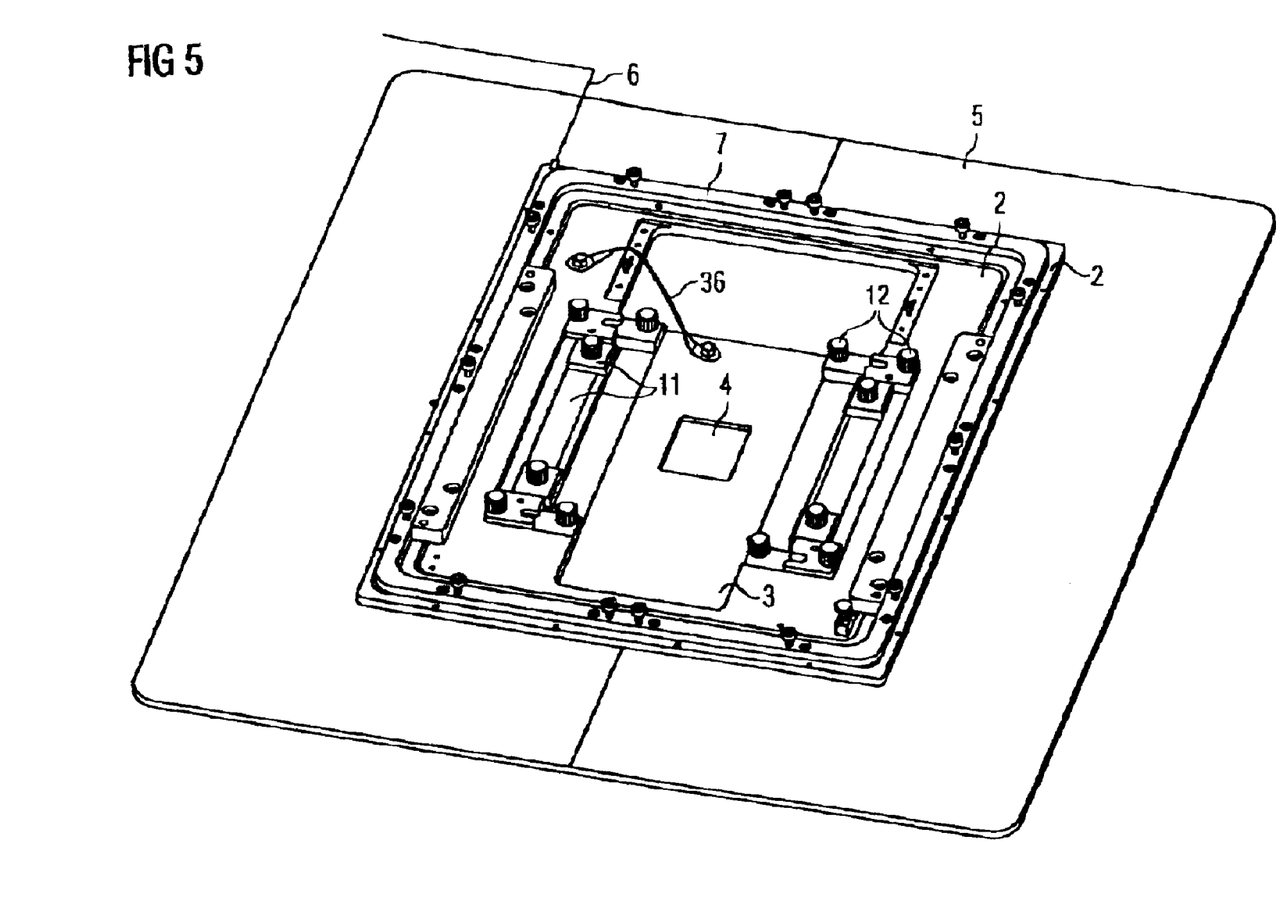
FIG. 5 is similar to FIG. 1 and shows another aspect of the invention

In a probe card adapter 2 according to FIG. 1 a rectangular probe card 3 is mounted with various mounting brackets 11 and screws 12. The probe card adapter 2 is implemented in multiple parts for adapting other probe cards 3. The probe card 3 has a central rectangular passageway 4, through which probes, which are not represented, can contact a test substrate disposed below the probe card 3 but not represented. To the underside of the probe card 3 a metal layer 37 is applied, in a process known in the art as "metallization," said metal layer 37 being electrically connected to the probe card adapter 2, as shown in FIG. 2A in more detail. The electrical connection can be made, for example, as shown in FIG. 2A, by including the peripheral side faces 38 of the probe card 3, with which there is contact with the probe card adapter 2, in the metallization of the underside 39 of probe card 3, or also by suitable connectors, for example, by one or more connectors 36 shown in FIG. 5.

The probe card adapter 2 is mounted at the center of a rectangular plate which forms the shield 5. Since in the present example the probe card adapter 2, like the shield 5, consists of electrically conductive material, it is electrically connected to the shield 5 over the entire contact surface.

As can be seen in the sectioned representation of FIG. 2 the connections between the probe card 3 and the probe card adapter 2, as well as between the probe card adapter 2 and the shield 5, are shaped in the form of steps so that the underside of the component represented is an electrically conductive surface closed up to the probe card's central passageway 4. The entire component is connected via a cable 6 to the output of a voltage correction circuit not represented in more detail, whose input can be connected to the receiving surface of the chuck of a testing device so that a potential can be applied to the component according to FIG. 1, said potential being equal in magnitude to the potential of the receiving surface of the chuck.

On the probe card adapter a frame 7 consisting of an electrically insulating material is disposed by means of additional mounting brackets 11 and screws 12, where, with the frame, the entire component can be mounted on the probe card holder 1. The probe support in which the component according to FIG. 1 is mounted on the probe card holder 1 is represented in FIG. 2. In the sectioned representation of FIG. 2 a gap 8 between the probe card holder 1 and the shield 5 can be seen, said gap completely insulating the two components from one another electrically. It is obvious that this gap can be filled by an electrically insulating material or that other mounting means can also be used for the mechanical connection between the probe card holder 1 and the probe card adapter 2, to the extent that both components are electrically insulated from one another.

As mentioned above, the probe support is always described with a probe card adapter 2 for adapting probe cards 3, which can be different, for example, with regard to their shape, their electrical and mechanical properties, or their supply requirements for the electrical connection of the probes. If, however, such adapting is not required, the probe support can obviously be implemented without a probe card adapter 2, where the described properties of the probe cards 3 as well as the probe card adapter 2 must be satisfied by this new probe card 3 independently of whether it is implemented in the form of a single part or multiple parts. Thus, for this development reference can be made to the explanations above.

The positioning of test substrates 20, which are disposed, separated or in the complete wafer, in the form of a grid on the receiving surface of a chuck of a testing device, will be explained on a test substrate 20 with eight contact surfaces 21, four in a row with both rows lying opposite to and parallel to one another. This test substrate 20 is, in the embodiment example described, a part of a wafer which comprises a plurality of such test substrates 20 disposed in a grid. Also, individual test substrates 20 are usually disposed in the form of a grid on the receiving surface of the chuck, or at least their position relative to one another is known.

In each case the test substrates 20 are aligned on the chuck so that the grid arrangement has one direction which agrees with the direction in which a row of contact surfaces 21 lies and which agrees with one direction of motion of the chuck 24, for example, the x-direction. This direction of the grid arrangement will be denoted in the following as the preferred direction of the contact surface arrangement 25 of the test substrate. The second direction of the grid agrees with the second direction of motion, the y-direction, of the chuck 24.

The eight contact surfaces 21 of a test substrate 20 are contacted by eight sensor tips 22 which are disposed so as to correspond to the arrangement of the contact surfaces 22 with respect to one another. That is, every four sensor tips 22 are disposed in one row and both rows are disposed lying opposite to and parallel to one another. The direction of the sensor tip rows will be denoted in the following as the probe arrangement's preferred direction 26. The plane in which all the sensor tips 22 are disposed lies parallel to the surface of the test substrate 20.

Figure 3A:
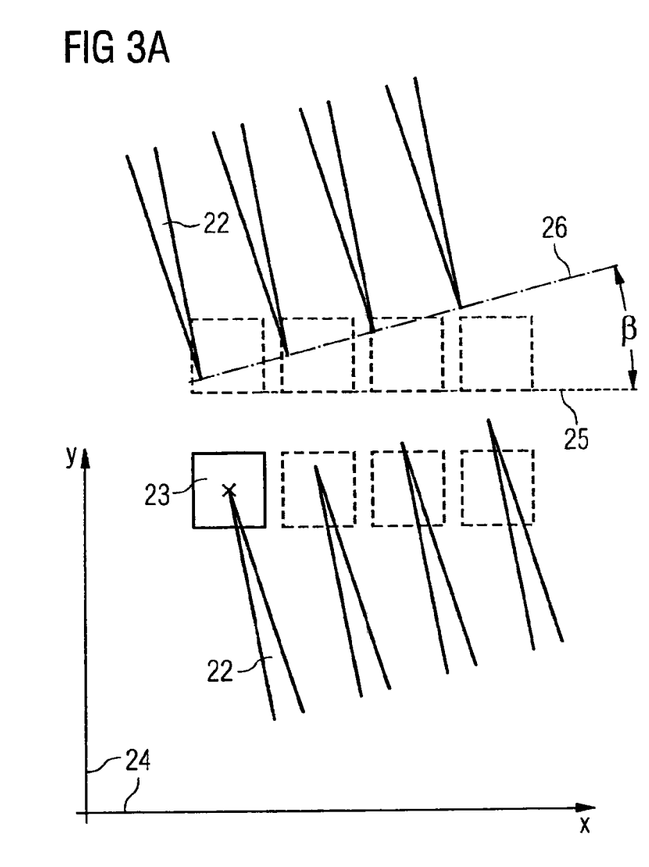
FIG. 3A to FIG. 3C shows a positioning process of a reference point, and, near to it, a contact surface arrangement with respect to sensor tips.
Figure 3B:
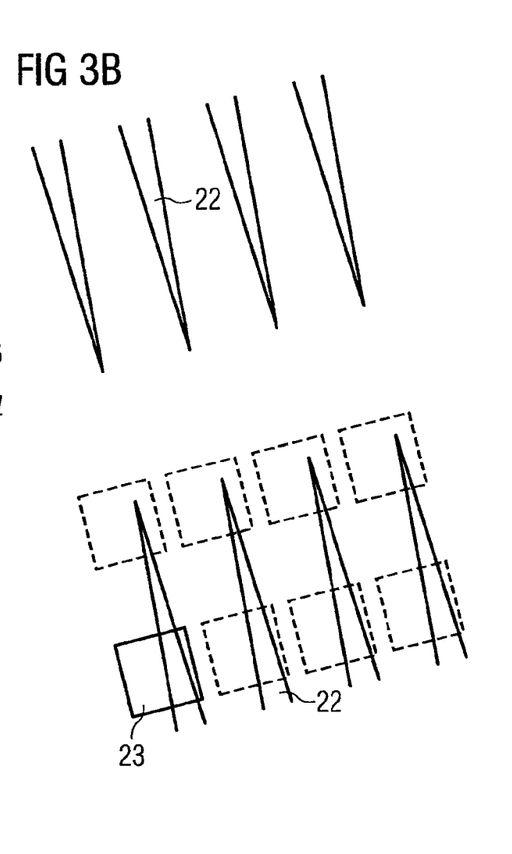
Figure 3C:
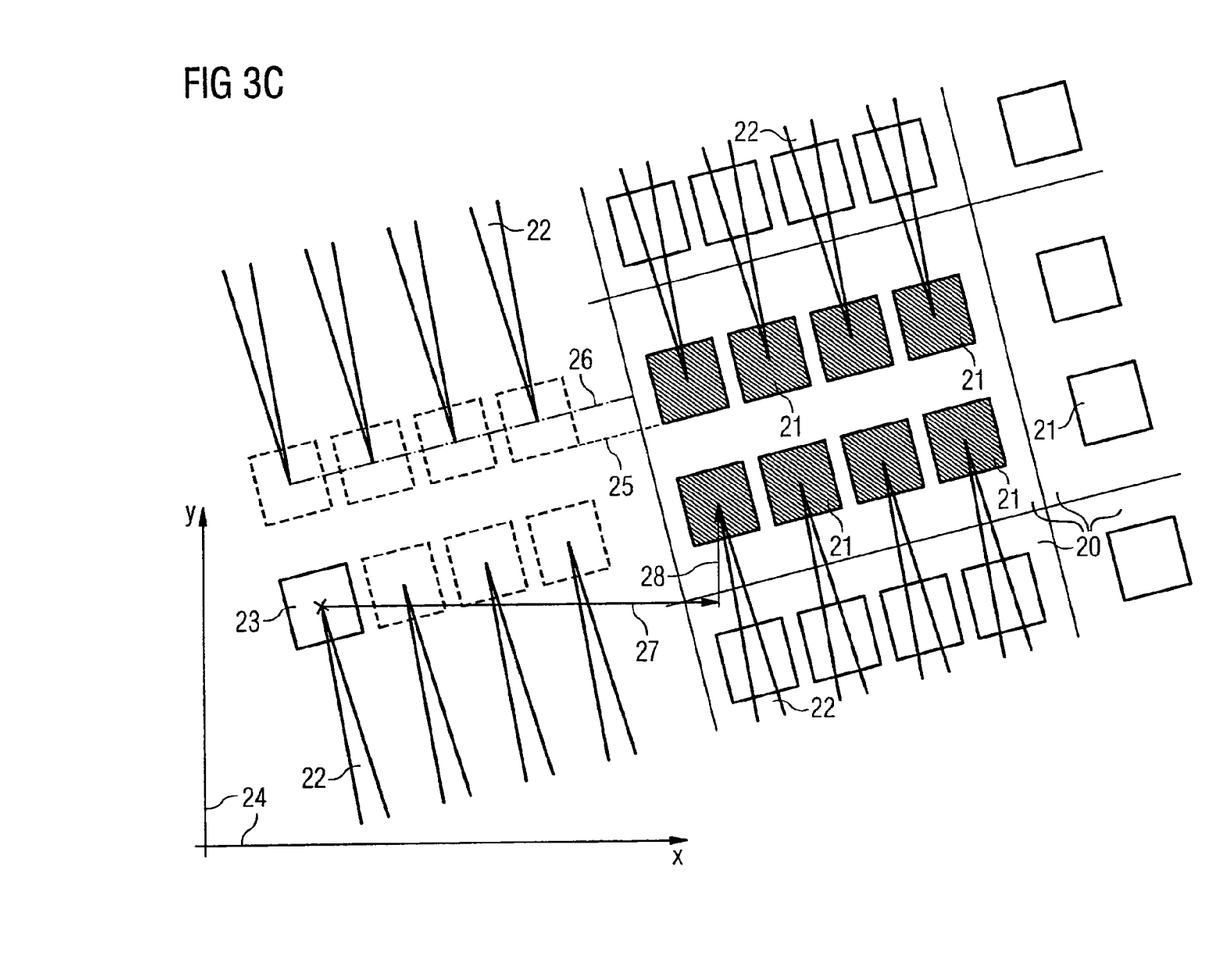

In FIGS. 3A to 3C the common positioning of the eight sensor tips 22 with respect to the contact surfaces 21 of a test substrate is represented. In the same manner simpler or more complex arrangements of contact surfaces 21 can be contacted.

FIG. 3A represents the alignment of the center of one of the sensor tips 22 to a reference point 23 which, as the first reference position in the x-y coordinate system of the plane of motion of the chuck, is the starting point of a positioning process for the measurement of a grid of test substrates 20. For the sake of a better overview, additional surfaces in one such position relative to the reference point 23 are represented in FIGS. 3A to 3C so that the arrangement of the contact surfaces 21 of a test substrate 20 to be contacted subsequently can be recognized. With the aid of this assumed arrangement of contact surfaces 21 it can be seen that there is an angle of $\beta$ between the contact surface arrangement's preferred direction 25 and the probe arrangement's preferred direction 26 so that the remaining seven sensor tips 22 are not correctly aligned to the contact surfaces 21.

In a next step the angle $\beta$ is determined and the receiving surface of the chuck is turned by this angle $\beta$, but in the direction opposite to the defined direction of turning, so that both preferred directions 25, 26 coincide (FIG. 3B). According to the definition of the preferred direction 25 of the contact surface arrangement the angle $\beta$ can be 90° instead of 0°. That would be the case if this preferred direction 25 were defined by two contact surfaces 21 lying opposite one another each in a row.

The turning is done about the axis of rotation of the chuck which is perpendicular to the receiving surface and usually lies in the center of the wafer but not in every case because of, for example, tolerances of the disposition of the wafer on the receiving surface. The turning can be done according to the configuration of the chuck, for example, by turning the chuck itself or by turning a support plate which is disposed on the surface of the chuck (add-on plate) and whose surface is the receiving surface of the chuck. The determination of the angle $\beta$ can be done, for example, with the aid of the imaging of the positions of the sensor tips 22 and the contact surfaces 21 or with the aid of the turning of the receiving surface being executed with simultaneous monitoring of the positions relative to one another.

As a consequence of the angular alignment about an axis of rotation outside of the reference point 23 its position with respect to the sensor tip 22 changes according to the representation in FIG. 3B. This incorrect position is subsequently corrected by the chuck, specifically by the chuck being traversed, e.g., by means of an x-y cross table, in its x-direction of motion and its y-direction of motion 24 by a corresponding correction component in the x-direction and the y-direction (FIG. 3C). The second reference position thus set is the starting position from which one traverses to the first test substrate 20 to be contacted.

Since according to FIG. 3C the sensor tips 22 are in line with the contact surfaces 21 but the contact surfaces 21 are not in line with the directions of motion of the chuck 23, the traversing to the position of the first test substrate is done by the path in the x-direction which would be required in the case of in-line alignment of the test substrates to the directions of motion of the chuck being expanded by one increment in the y-direction in order to compensate the turning of the chuck by the angle $\beta$. The resulting path is thus composed of an x-component 27 and a y-component 28 (FIG. 3C), where the y-component corresponds to the sine of the angle $\beta$. With one grid increment approximately in the y-direction, the described relationship between the x-direction and the y-direction is obviously reversed.

After the traverse to the x-y position of the test substrate 20 with respect to the sensor tips 22, said position being denoted in the following as the contacting position, there is an infeed of the chuck in the z-direction until the sensor tips 22 have securely contacted the contact surfaces 21. After the measurement of the first test substrate 20, contact is once again broken off by lowering the chuck and there is a traverse to the contacting position of the next test substrate 20 on a traverse path which is also composed of an x-component and a y-component. Thereupon there is an infeed between the test substrate 20 and the sensor tips 22 in the z-direction and a new measurement process. In this way one traverses sequentially to the individual test substrates of the grid so that the movement of the chuck in the x-direction and y-direction resembles a sawtooth line.

To the extent that in one development of the process the reference point 23 is in a position on the wafer and corresponding to the grid of the test substrates 20, the x-component 27 and the y-component 28 for traversing to the position of the second, and each additional, test substrate 20 within one row of the grid corresponds to those of the path of traverse from the reference point 23 to the first test substrate 20. Otherwise, this path of traverse is to be corrected appropriately. The correction can, for example, be determined numerically on the basis of the known position of the reference point with respect to the first test substrate to which one traversed. Alternatively, the second, adjacent test substrate 20 can be traversed to and the x-component 27 and the y-component 28 of this path of traverse can be the basis of the positioning of each additional test substrate 20 of the grid.

In the discussion above, the x-component and the y-component for traversing to the contacting positions of the test substrates 20 were determined by executing and evaluating the necessary positioning processes up to the first, or alternatively up to the second, test substrate 20. Alternatively, both components can also be determined numerically if the x-coordinate and the y-coordinate of the first reference position in the x-y coordinate system of the chuck are known after traversing to said first reference position and the turning of the support surface by a known angle $\beta$ has been accomplished so that both preferred directions are aligned at an angle of 0° or alternatively 90° to one another. With the aid of the knowledge of the position of the first, and each additional, contact surface relative to the reference point, the contacting positions can be determined and from them the x-components 27 and the y-components 28 of this path of traverse.

Figure 4:
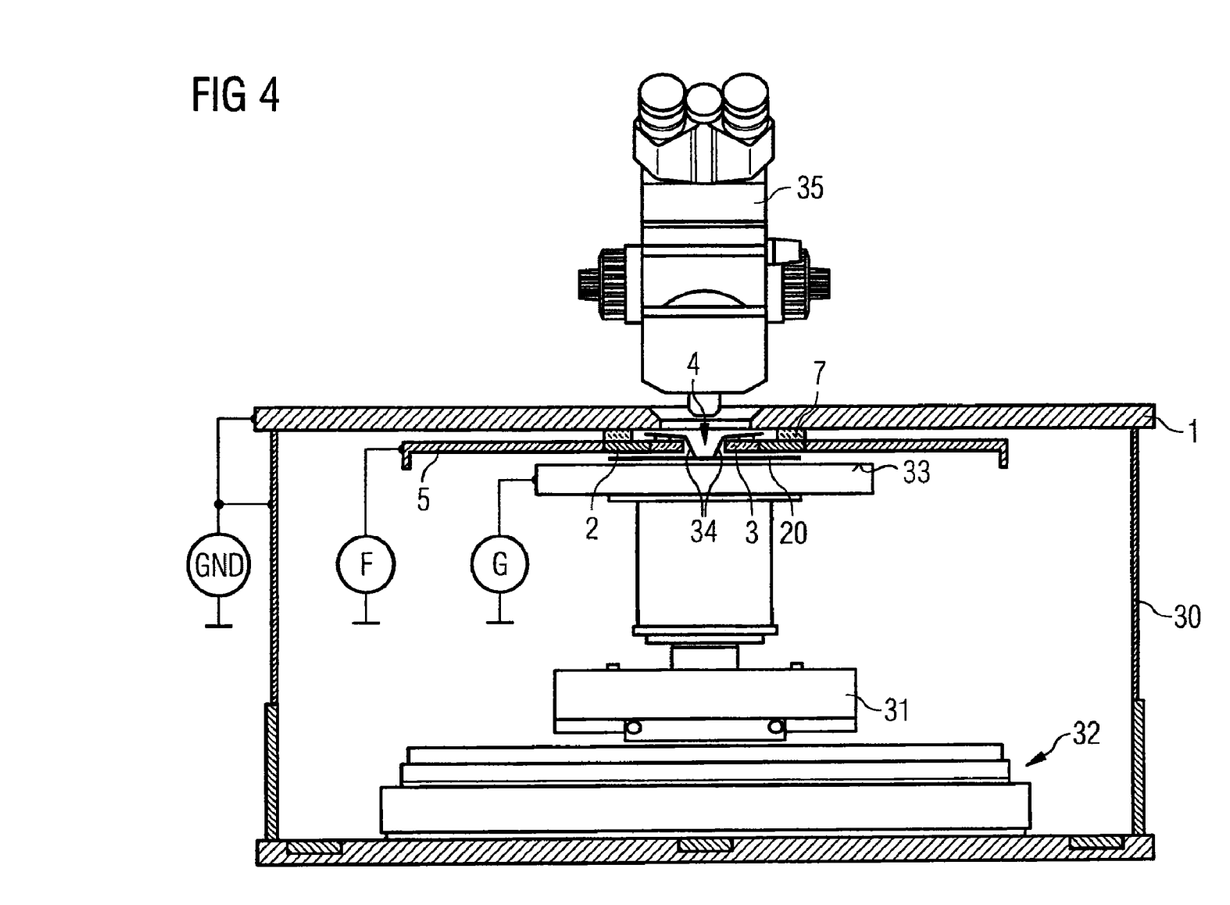
FIG. 4 shows a testing device using a probe support according to FIG. 2.

FIG. 4 represents a prober with a probe support according to the description above. In a housing 30 a chuck 31 with a positioning device 32 is disposed. The chuck comprises a receiving surface 33 on which a wafer 20 or a plurality of individual test substrates 20 can be disposed. By means of the positioning device 32 of the chuck 31 the receiving surface 33 can be moved in the x-direction, y-direction, and z-direction and can be turned about a central axis The probe support is disposed lying opposite the receiving surface 33, where the structure of said probe support is essentially that described above and the same components are denoted by the same reference numbers so that reference can be made to the above description of the probe support. In a development not represented in more detail the probe support also comprises a positioning device with which the probe support can be traversed in the z-direction for a final infeed movement.

The probe support consists of a plate-like probe card holder 1 which is disposed on the housing in such a manner that it closes the housing 30 from above. While the probe card holder 1, together with the housing 30, is at ground potential and the receiving surface 33 of the chuck 31 is at a first potential differing from ground, the probe card adapter 2, the electrically conductive layer on the underside of the probe card 3, and the shield 5 are electrically connected to one another and are set to a second potential which corresponds in magnitude to the first potential of the receiving surface of the chuck.

On the probe card 3 a plurality of probes 34 is disposed which contact the test substrate through the central passageway 4 in the probe card 3. The probes 34 are connected via printed conductors, not represented in more detail, on the probe card 3 and suitable connectors to a signal processing device (not represented). The positioning and the contacting of the test substrates are to be monitored and evaluated by means of a monitoring device 35.

The invention claimed is:

1. Probe support for the electrical contacting of test substrates to be tested in a prober comprising:
   (a) a probe card for receiving probes,
   (b) a probe card adapter for receiving and adapting the probe card,
   (c) a probe card holder for holding the adapted probe card,
   (d) a shield of electrically conductive material for electromagnetic shielding of a test substrate,
   (e) wherein the shield is disposed between the probe support and the test substrate and is electrically insulated from the probe card holder,
   (f) wherein the probe card holder and the shield comprise passageways corresponding to one another through which the probes contact the test substrate and the probe card is disposed by the probe card adapter in a passageway of the shield, and
   (g) where the probe card adapter is electrically insulated from the probe card holder and is electrically connected to the shield.

2. Probe support according to claim 1, wherein the probe card adapter with the adapted probe card is structured in such a manner that the passageway of the shield is filled up.

3. Probe support according to claim 1, wherein a surface of the probe card facing towards the test substrate, is electrically conductive and electrically connected to the probe card adapter and in addition has no electrically conducting connection to incoming electrical lines for the probes on the probe card.

4. Probe support according to claim 1, wherein the shield is fastened, electrically insulated, to the probe card holder.

5. Probe support according to claim 1, wherein the probe card adapter is fastened, electrically insulated, to the probe card holder.

6. Prober for testing test substrates comprising:
   (a) a chuck arrangement with receiving surface for receiving a plurality of test substrates,
   (b) a probe support for receiving probes,
   (c) wherein the probe support comprises a probe card for receiving the probes, a probe card adapter for receiving and adapting the probe card, and a probe card holder for holding the adapted the probe card,
   (d) at least one positioning device for positioning each test substrate in three spatial directions x, y, and z with respect to the probes,
   (e) a shield for electromagnetic shielding of the test substrates,
   (f) wherein the shield is disposed between the probe support and the test substrates and is electrically insulated from the probe card holder,
   (g) wherein the probe card holder and the shield comprise passageways corresponding to one another through which each of the probes contacts a test substrate,
   (h) wherein the probe card is disposed by the probe card adapter in a passageway of the shield, and
   (i) wherein the probe card adapter is electrically insulated from the probe card holder and is electrically connected to the shield.

7. Prober according to claim 6, wherein the probe card adapter with the adapted probe card is structured in such a manner that the passageway of the shield is completely filled up.

8. Prober according to claim 6, wherein a surface of the probe card facing towards the test substrates, is electrically conductive and in addition has no electrically conducting connection to incoming electrical lines for the probes on the probe card.

9. Prober according to claim 6, wherein the shield is fastened, electrically insulated, to the probe card holder.

10. Prober according to claim 6, wherein the probe card adapter is fastened, electrically insulated, to the probe card holder.

11. Prober according to claim 6, wherein the prober comprises an electrically conductive external housing.

12. Prober according to claim 11, wherein the external housing is at ground potential, the receiving surface of the chuck is at a first potential differing from the ground potential, and the shield is at a second potential which is equal in magnitude to the first potential.

* * * * *